(12) United States Patent
Alexander et al.

(10) Patent No.: US 8,429,367 B2
(45) Date of Patent: Apr. 23, 2013

(54) SYSTEMS, METHODS AND APPARATUSES FOR CLOCK ENABLE (CKE) COORDINATION

(75) Inventors: James W. Alexander, Hillsboro, OR (US); Son H. Lam, Puyallup, WA (US); Devadatta V. Bodas, Federal Way, WA (US); Krishna Kant, Portland, OR (US); Kai Cheng, Portland, OR (US); Ian M. Steiner, Hillsboro, OR (US); Gopikrishna Jandhyala, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 680 days.

(21) Appl. No.: 11/965,953

(22) Filed: Dec. 28, 2007

(65) Prior Publication Data

US 2009/0172681 A1 Jul. 2, 2009

(51) Int. Cl.
*G06F 1/04* (2006.01)
(52) U.S. Cl.
USPC ............... 711/169; 711/5; 711/167; 713/500; 713/600; 365/233.1

(58) Field of Classification Search ............... 365/233.1, 365/233.5, 233.11, 233.14–15; 713/320, 713/322–323, 500, 502, 600–601
See application file for complete search history.

(56) References Cited

U.S. PATENT DOCUMENTS

| 7,159,082 | B1 * | 1/2007 | Wade ............................. 711/155 |
| 7,191,088 | B1 * | 3/2007 | Reed et al. ..................... 702/130 |
| 7,523,282 | B1 * | 4/2009 | Kapil et al. .................... 711/167 |
| 7,721,011 | B1 * | 5/2010 | Sutera ............................... 710/6 |
| 2003/0061458 | A1 * | 3/2003 | Wilcox et al. ................. 711/167 |
| 2008/0025125 | A1 * | 1/2008 | Rajan et al. .................... 365/227 |
| 2009/0055570 | A1 * | 2/2009 | Madrid et al. .................... 711/5 |

* cited by examiner

*Primary Examiner* — Christian P Chace
*Assistant Examiner* — Nicholas Simonetti
(74) *Attorney, Agent, or Firm* — Blakely, Sokoloff, Taylor & Zafman LLP

(57) ABSTRACT

Embodiments of the invention are generally directed to systems, methods, and apparatuses for clock enable (CKE) coordination. In some embodiments, a memory controller includes logic to predict whether a scheduled request will be issued to a rank. The memory controller may also include logic to predict whether a scheduled request will not be issued to the rank. In some embodiments, the clock enable (CKE) is asserted or de-asserted to a rank based, at least in part, on the predictions. Other embodiments are described and claimed.

16 Claims, 4 Drawing Sheets

SYSTEMS, METHODS AND APPARATUSES FOR CLOCK ENABLE (CKE) COORDINATION

TECHNICAL FIELD

Embodiments of the invention generally relate to the field of information technology and, more particularly, to systems, methods and apparatuses for clock enable (CKE) coordination.

BACKGROUND

There are a number of control signals that are typically used to control synchronous dynamic random access memory (SDRAM). These control signals include a clock signal and clock enable signal (or simply CKE). In general, the commands used in SDRAM are timed relative to one or more edges of the clock signal. The CKE refers to a signal that enables or disables the clock signal. When the CKE is asserted an SDRAM responds to commands relative to one or more edges of the clock signal. When the CKE is de-asserted the SDRAM behaves as if the clock has stopped.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In conventional systems, CKE lingers in the on (or asserted) state for many cycles after all of the in-flight transactions to a rank have completed. This approach, which is sometimes referred to as the "CKE timer" or the CKE runway," strikes a balance between saving a certain amount of power (because CKE is eventually de-asserted) and protecting performance (because CKE stays asserted long enough for the rank to, on average, process enough operations to justify de-asserting CKE without incurring too great a performance penalty). That is, this technique increases the residency of the CKE off (or de-asserted) state while minimizing the number of CKE-off-to-on exit latency penalties for new requests that appear over time.

Embodiments of this invention recognize the problem of extraneous power consumption that is associated with the CKE timer technique. For example, in some cases, the CKE exit-latency can be masked (or overlapped with) a rank turnaround resource conflict. As is further described below, in some embodiments, a memory controller includes logic to predict whether or not a pending request will be issued to a rank of memory. If the prediction indicates that a pending request will not be issued to the rank of memory, then CKE may be de-asserted to the rank.

Figure 1:
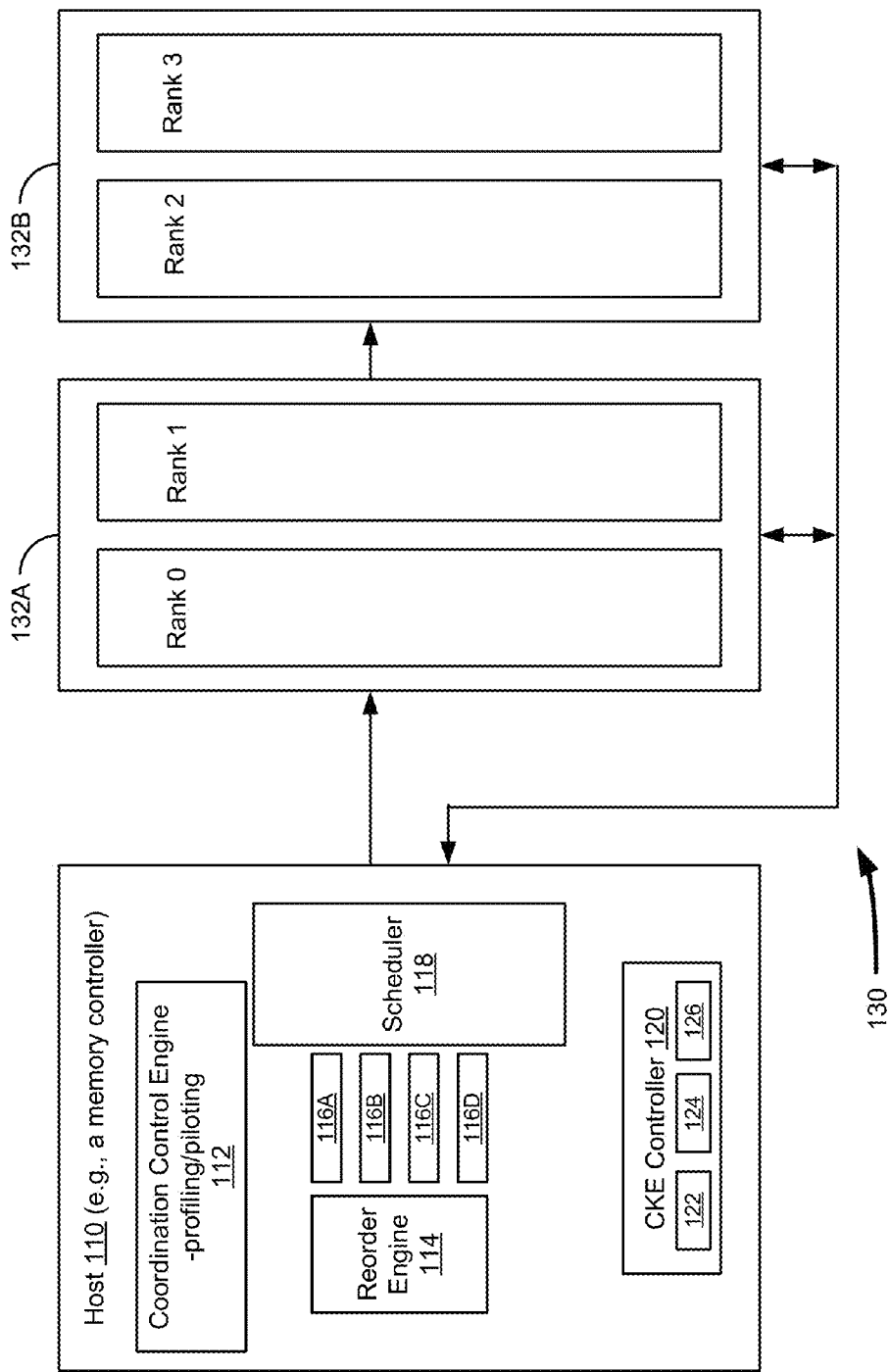
FIG. 1 is a block diagram illustrating selected aspects of a computing system implemented according to an embodiment of the invention.

FIG. 1 is a high-level block diagram illustrating selected aspects of a computing system implemented according to an embodiment of the invention. In the illustrated embodiment, system 100 includes host 110 (e.g., a memory controller) and memory channel 130. For ease of discussion, FIG. 1 shows a single memory channel 130 having two memory modules 132 each of which includes two ranks of memory (e.g., rank 0 through rank 3). It is to be appreciated that system 100 may include more than one memory channel 130 and memory channel 130 may include a different number of modules which may, in turn, include a different number of ranks. More generally, in alternative embodiments, system 100 may include more elements, fewer elements, and/or different elements.

Memory modules 132 may be any of a wide variety of memory modules including, for example, dual inline memory modules (DIMMs). The term "rank" broadly refers to a set of memory devices sharing the same chip select signal. In some embodiments, each rank includes one or more synchronous dynamic random access memory devices (SDRAMs). It is to be appreciated that modules 132 and one or more of ranks 0-3 may include elements that are not illustrated FIG. 1 as they are peripheral to embodiments of the invention (e.g., registers, serial presence detect, and the like).

Host 110 controls the transfer of data to and from memory channel 130. In some embodiments, host 110 is integrated onto the same die as one or more processors. In alternative embodiments host 110 is part of the chipset for system 100. In the illustrated embodiment, host 110 includes coordination control engine 112, reorder engine 114, request queues 116, scheduler 118, and CKE controller 120. In alternative embodiments, host 110 includes more elements, fewer elements, and/or different elements than those illustrated in FIG. 1.

Coordination control engine 112 includes logic to dynamically determine a dwell period for the ranks in memory channel 130. The term "dwell period" refers to a period of time that host 110 interacts with a selected rank while throttling the remaining ranks. Reorder engine 114 determines the order of the requests that are queued in request queues 116. Request queues 116 include the requests (e.g., reads, writes, etc.) that are queued for ranks 0-3. For ease of illustration, FIG. 1 shows four request queues 116 (e.g., one per rank). It is to be appreciated, however, that host 110 may include more queues or fewer queues depending on the implementation of a given host. Scheduler 118, inter alia, schedules the issuance of the requests queued in request queues 116.

CKE controller 120 includes logic to control the assertion and de-assertion of CKE to each of ranks 0-3. In the illustrated embodiment, CKE controller includes CKE timer logic 122, CKE off predictor logic 124, and CKE on predictor logic 126. In alternative embodiments, CKE controller 120 includes more elements, fewer elements, and/or different elements.

CKE timer logic 122 supports a conventional feature in which CKE is allowed to linger in the on state for many cycles after the in-flight transactions to a rank have completed. In some embodiments, if all of the pending requests are scheduled for a particular rank, then CKE controller 120 reverts to the conventional CKE timer technique. The reason for this is that predictor logic 124 and 126 are unlikely to save power, if all of the pending requests are scheduled for a particular rank.

In some embodiments, for each rank, predictor logic 124 predicts whether the next request is not going to be scheduled to the rank. Similarly, for each rank, predictor logic 126 predicts whether the next request is going to be scheduled to the rank. Each of logic 124 and 126 evaluates a number of conditions to formulate its respective prediction. These conditions, as discussed below, use the terms "this," "the other," and another" when referring to ranks. The term "this rank" refers to the rank which will toggle its CKE signal. The term "the other rank" refers to the rank that the scheduler will continue scheduling. The term "another rank" includes "the other rank" but excludes "this rank."

In some embodiments, predictor logic 124 predicts whether the next request will not be scheduled to "this rank." This prediction may be done for every rank (e.g., in parallel). In addition, this prediction may be done on a cycle-by-cycle basis. Predictor logic 124 may formulate its prediction by evaluating one or more conditions. Table 1 illustrates the conditions evaluated in some embodiments of the invention. In alternative embodiments, more conditions, fewer conditions, and/or different conditions may be evaluated.

TABLE 1

| No. | Condition |
| --- | --- |
| 1 | the previously scheduled request to this channel went to the other rank |
| 2 | the other rank has another pending request of the same type (read or write) |
| 3 | the other rank has not reached its electrical-throttling limit (e.g., tFAW) |
| 4 | a pending request to this rank is not in panic mode, or a pending request to another rank is in "panic" mode |
| 5 | the scheduler's "major mode" (e.g., prefer read or prefer write) has not shifted since the previously scheduled request |
| 6 | at least one pending request of the same type to the other rank does not conflict with a busy bank |

If all of the conditions shown in Table 1 are true, then a pending transaction to this rank will not be scheduled next. In many embodiments, however, condition six is not evaluated because of the costs and complexity of the hardware that is required to evaluate the condition. In some embodiments, the evaluation of conditions one and two involve the addition of "state" (e.g., to "remember" which rank was previously scheduled) to the scheduler 118. In some embodiments, the evaluation of condition five also involves the addition of "state" (e.g., to "remember" the previous "major mode"). In some embodiments, when conditions one through five are true and all in-flight transactions to "this rank" have completed in this cycle, then CKE is de-asserted to "this rank."

In some embodiments, predictor logic 126 predicts whether the next request will be scheduled to "this rank." This prediction may be done for every rank (e.g., in parallel). In addition, this prediction may be done on a cycle-by-cycle basis. Predictor logic 126 may formulate its prediction by evaluating one or more conditions. Table 2 illustrates the conditions evaluated in some embodiments of the invention. In alternative embodiments, more conditions, fewer conditions, and/or different conditions may be evaluated.

TABLE 2

| No. | Condition |
| --- | --- |
| 1 | the previously scheduled request to this channel went to another rank |
| 2 | the other rank does not have a pending request (either the same or different type) OR the other rank has hit or is in the midst of working off its electrical throttling limit |
| 3 | this rank's CKE is de-asserted |
| 4 | this rank's minimum CKE = off " entry latency" (tCKE) delay has elapsed |
| 5 | a request is pending to this rank |

TABLE 2-continued

| No. | Condition |
| --- | --- |
| 6 | this rank has a request at the head of the re-order queue |
| 7 | there is no request pending to any other rank that is in "panic mode" OR a request pending to this rank is in "panic" mode |
| 8 | thermal throttling isn't holding this rank's CKE off |

In some embodiments, if all eight of the conditions listed in Table 2 are true, then there is a very high probability that a pending transaction to "this rank" will be scheduled next. In such embodiments, if all eight of the conditions are valid, then "this rank's" CKE is asserted.

Figure 2:
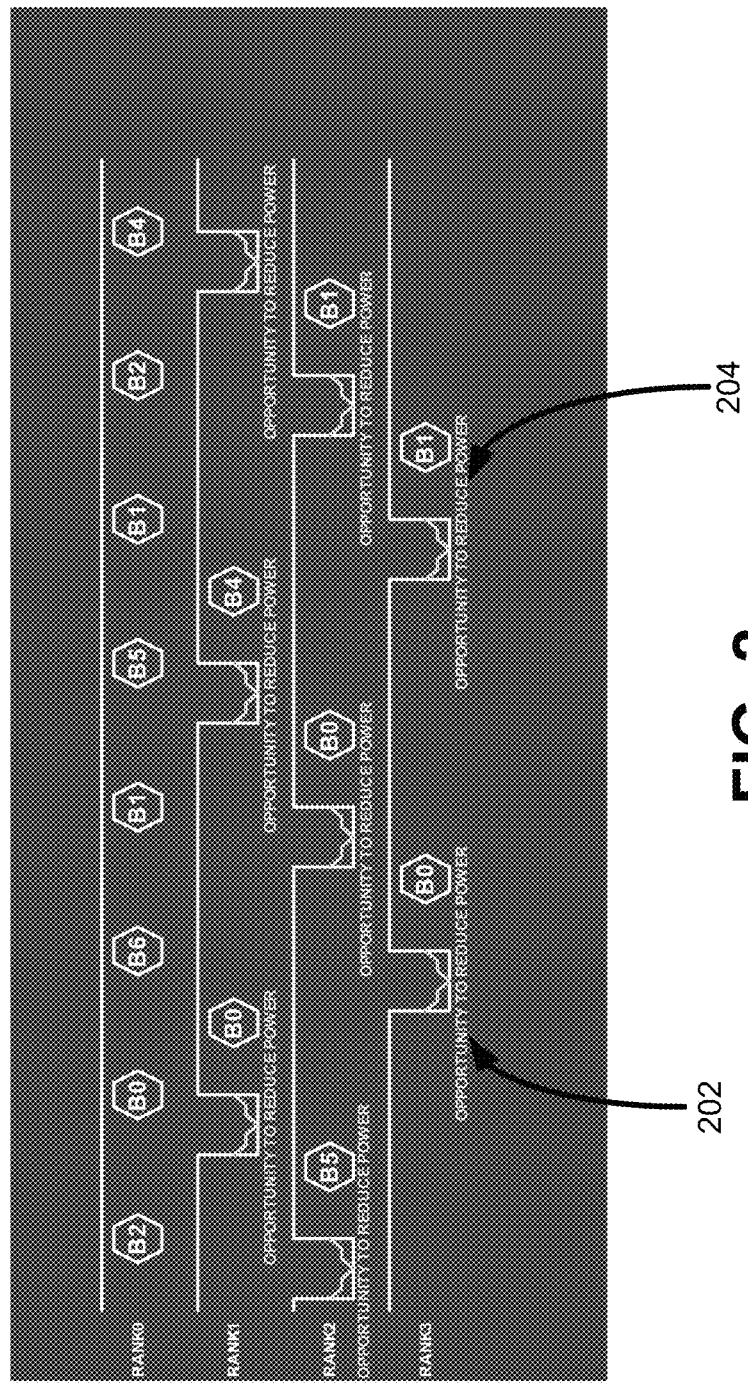
FIG. 2 is a high-level timing diagram illustrating selected aspects of CKE coordination according to an embodiment of the invention.

FIG. 2 is a high-level timing diagram illustrating selected aspects of CKE coordination according to an embodiment of the invention. In some embodiments, a CKE controller (e.g., CKE controller 120, shown in FIG. 1) evaluates each of ranks 0-3, on a cycle-by-cycle basis, to determine whether to assert or de-assert CKE to the rank. In the illustrated embodiment, the CKE controller maintains the assertion of CKE to rank 0 over the illustrated period. For each of the other ranks, however, the CKE controller is able to predict windows during which power can be saved by temporarily de-asserting CKE to the ranks. For example, the CKE controller de-asserts CKE to rank 3 at 202 and 204. Similarly, the CKE controller identifies opportunities to save power by periodically de-asserting CKE to rank 1 and rank 2.

Figure 3:
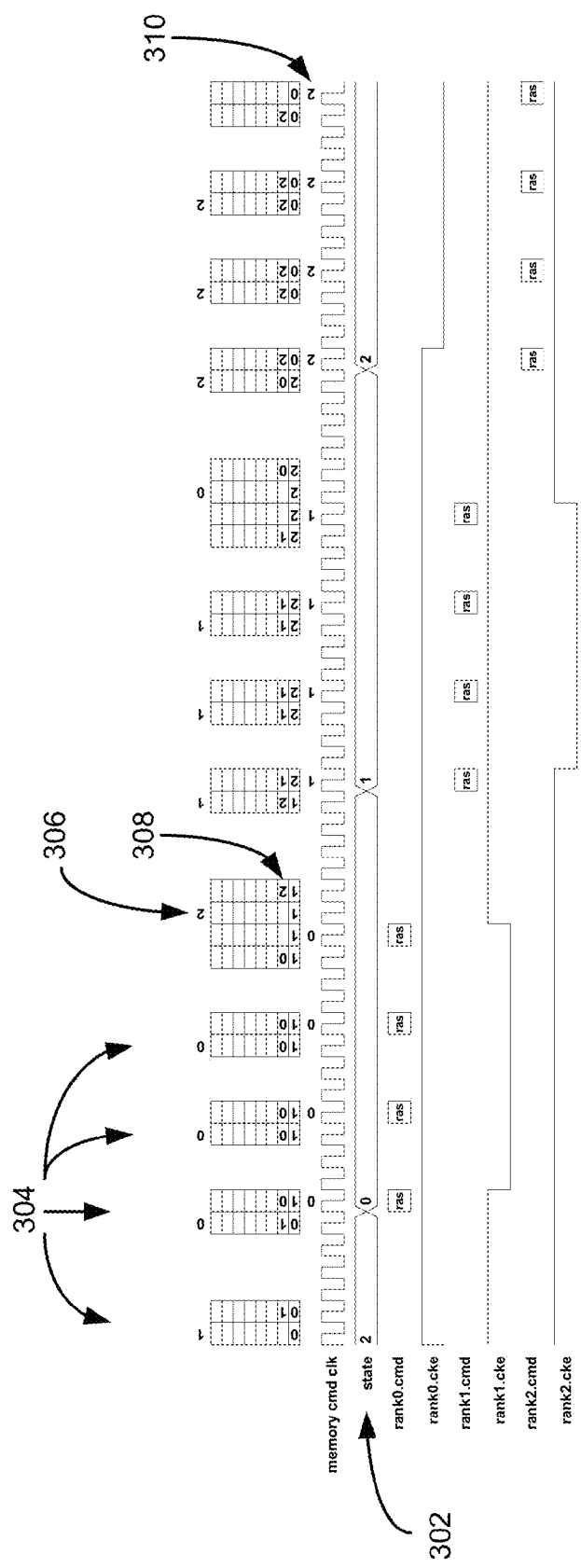
FIG. 3 is a more detailed timing diagram illustrating selected aspects of CKE coordination according to an embodiment of the invention.

FIG. 3 is a more detailed timing diagram illustrating selected aspects of CKE coordination according to an embodiment of the invention. Diagram 300 illustrates "state" information such as the last rank that was scheduled at 302. In addition, the request queue is illustrated at the top of diagram 300 (e.g., at 304). A request destined for the queue but that has not yet entered the queue appears above the queue (e.g., at 306). In the next cycle, when the request enters the queue, it is shown at the tail of the queue (e.g., 308). Requests exit from the head of the queue at the bottom coincident with the scheduling of a "RAS" on the rank (e.g., at 310).

Figure 4:
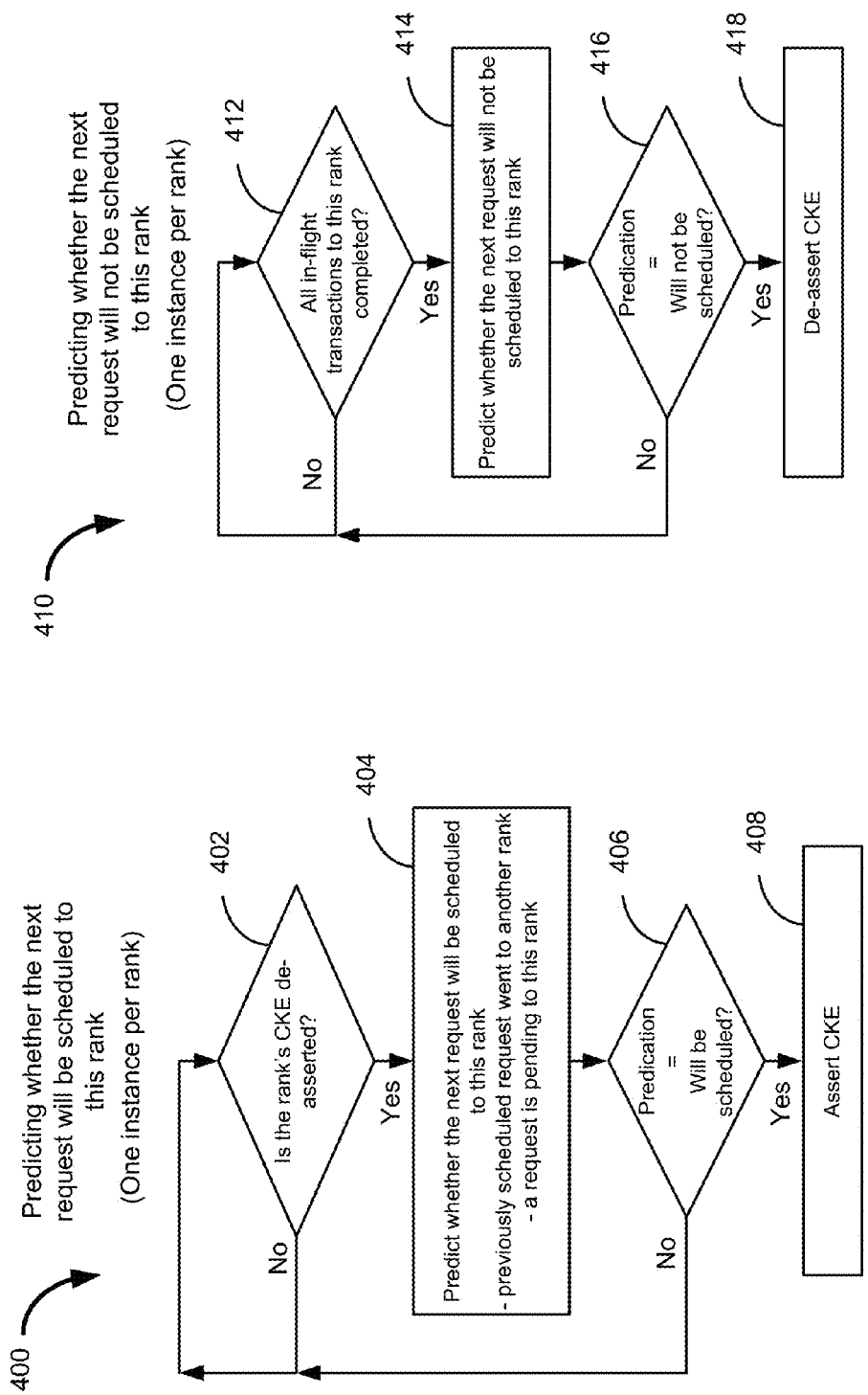
FIG. 4 is a flow diagram illustrating selected aspects of a method for CKE coordination according to an embodiment of the invention.

FIG. 4 is a flow diagram illustrating selected aspects of a method for CKE coordination according to an embodiment of the invention. In some embodiments, a CKE controller (e.g., CKE controller 120, shown in FIG. 1) dynamically employs algorithms 400 and 410 to determine whether to assert or de-assert CKE to a rank. The determination may be made for each rank on a cycle-by-cycle basis. In alternative embodiments, different algorithms may be used.

In some embodiments, the CKE controller uses algorithm 400 to predict whether the next request will be scheduled to "this rank." Referring to process block 402, the CKE controller determines whether "this rank's" CKE is de-asserted. If CKE is de-asserted, then the CKE controller determines the status of a number of conditions to predict whether the next request will be scheduled to "this rank" (at 404). In some embodiments, if the prediction indicates that the next request will be scheduled for "this rank" (406), then the CKE controller asserts CKE to "this rank" (408).

In some embodiments, the CKE controller uses algorithm 410 to predict whether the next request will not be scheduled to "this rank." Referring to process block 412, the CKE controller determines whether all in-flight transactions to "this rank" have completed. If the in-flight transactions have completed, then the CKE controller determines the status of a number of conditions to predict whether the next request will not be scheduled to "this rank" (at 414). In some embodiments, if the predication indicates that the next request will not be scheduled for "this rank" (416), then the CKE controller de-asserts CKE to "this rank" (418).

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
   scheduler logic to schedule a next request from pending requests for any one of a plurality of ranks of memory in a memory channel, each one of the plurality of ranks of memory representing a set of memory devices sharing a same chip select signal;
   clock enable (CKE) coordination logic to control a CKE signal to a rank of memory in coordination with the scheduler logic, the CKE coordination logic to:
   formulate a prediction as to whether the scheduler logic will or will not schedule the next request to the rank of memory, the prediction based on a combination of conditions that indicate the prediction is likely, the combination of conditions related to any two or more of:
   the other rank has reached its electrical throttling limit,
   the rank's minimum CKE delay has elapsed,
   thermal throttling is not de-asserting the rank's CKE,
   the scheduler logic has not shifted major mode since an immediately preceding scheduled request, and
   the other rank has a pending request of the same type;
   determine that the CKE signal to the rank of memory is de-asserted and assert the CKE signal to the rank of memory when the prediction is that the scheduler logic will schedule the next request to the rank of memory; and
   determine that the CKE signal to the rank of memory is asserted and de-assert the CKE signal to the rank of memory when the prediction is that the scheduler logic will not schedule the next request to the rank of memory.

2. The integrated circuit of claim 1, wherein the prediction that the scheduler logic will schedule the next request to the rank of memory is based on an affirmative determination of the combination of conditions wherein:
   the previously scheduled request to the memory channel went to one of the other ranks of memory in the memory channel; and
   there is a pending request for the rank of memory.

3. The integrated circuit of claim 2, wherein the prediction that the scheduler logic will schedule the next request to the rank of memory is further based on an affirmative determination of the combination of conditions wherein:
   there is no pending request for the other rank, or the other rank has hit its electrical throttling limit.

4. The integrated circuit of claim 1, wherein the prediction that the scheduler logic will schedule the next request to the rank of memory is further based on an affirmative determination of the combination of conditions wherein:
   the rank has a pending request at a head of a re-order queue; and
   thermal throttling is not de-asserting the rank's CKE.

5. The integrated circuit of claim 4, wherein the prediction that the scheduler logic will schedule the next request to the rank of memory is further based on an affirmative determination of the combination of conditions wherein:
   a pending request for the rank is in panic mode; or
   no pending requests for any of the other ranks is in panic mode.

6. The integrated circuit of claim 1, wherein the prediction that the scheduler logic will not schedule the next request to the rank of memory is based on an affirmative determination of the combination of conditions wherein:
   the other rank has not reached its electrical throttling limit; and
   the scheduler logic has not shifted major mode since an immediately preceding scheduled request.

7. The integrated circuit of claim 6, wherein the prediction that the scheduler logic will not schedule the next request to the rank of memory is further based on an affirmative determination of the combination of conditions wherein:
   the immediately preceding scheduled request went to one of the other ranks of memory in the memory channel; and
   the other rank has a pending request of the same type.

8. The integrated circuit of claim 7, wherein the prediction that the scheduler logic will not schedule the next request to the rank of memory is further based on an affirmative determination of the combination of conditions wherein:
   a pending request to the rank is not in panic mode; or
   a pending request to any other rank is in panic mode.

9. The integrated circuit of claim 8, wherein the prediction that the scheduler logic will not schedule the next request to the rank of memory is further based on an affirmative determination of the combination of conditions wherein:

thermal throttling of the rank is not in effect.

10. The integrated circuit of claim 1, wherein to formulate the prediction that the scheduler logic will or will not schedule the next request to the rank of memory is performed on a cycle-by-cycle basis.

11. The integrated circuit of claim 10, wherein to formulate the prediction that the scheduler logic will or will not schedule the next request to the rank of memory is performed in parallel for each rank on a cycle-by-cycle basis.

12. A method comprising:
   scheduling a next request from pending requests for any one of a plurality of ranks of memory in a memory channel, each one of the plurality of ranks of memory representing a set of memory devices sharing a same chip select signal;
   coordinating a CKE signal to a rank of memory with the scheduling of the next request, wherein coordinating comprises:
      formulating a prediction as to whether the scheduling of the next request will or will not be to the rank of memory, the prediction based on a combination of conditions that indicate the prediction is likely, the combination of conditions related to any two or more of:
         the other rank has reached its electrical throttling limit,
         the rank's minimum CKE delay has elapsed,
         thermal throttling is not de-asserting the rank's CKE,
         the scheduling of the next request has not shifted major mode since an immediately preceding scheduled request, and
         the other rank has a pending request of the same type;
      determining that the CKE signal to the rank of memory is de-asserted and asserting the clock enable (CKE) signal to the rank of memory when the prediction is that the scheduling of the next request will be to the rank of memory; and
      determining that the CKE signal to the rank of memory is asserted and de-asserting the CKE signal to the rank of memory when the prediction is that the scheduling of the next request will not be to the rank of memory.

13. The method of claim 12, wherein the method is performed on a cycle-by-cycle basis.

14. A system comprising:
   a memory channel including a plurality of ranks of memory, each one of the plurality of ranks of memory representing a set of memory devices sharing a same chip select signal;
   a request queue of pending requests for any one of the plurality of ranks of memory in the memory channel;
   a scheduler in communication with the request queue to schedule a next request from the pending requests for any one of the plurality of ranks of memory in the memory channel;
   a memory controller coupled with the memory channel and the scheduler, the memory controller including clock enable (CKE) coordination logic to control a CKE signal to a rank of memory in coordination with the scheduler, the CKE coordination logic to:
   formulate a prediction as to whether the scheduler will or will not schedule the next request to the rank of memory, the prediction based on a combination of conditions that indicate the prediction is likely, the combination of conditions related to any two or more of:
      the other rank has reached its electrical throttling limit,
      the rank's minimum CKE delay has elapsed,
      thermal throttling is not de-asserting the rank's CKE,
      the scheduler logic has not shifted major mode since an immediately preceding scheduled request, and
      the other rank has a pending request of the same type;
   determine that the CKE signal to the rank of memory is de-asserted and assert the CKE signal to the rank of memory when the prediction is that the scheduler will schedule the next request to the rank of memory; and
   determine that the CKE signal to the rank of memory is asserted and de-assert the CKE signal to the rank of memory when the prediction is that the scheduler will not schedule the next request to the rank of memory.

15. The system of claim 14, wherein the prediction that the scheduler will schedule the next request to the rank of memory is based on an affirmative determination of the combination of conditions wherein:
   the previously scheduled request to the memory channel went to one of the other ranks of memory in the memory channel; and
   there is a pending request for the rank of memory.

16. The system of claim 14, wherein the prediction as to whether the scheduler will or will not schedule the next request to the rank of memory is formulated for each rank on a cycle-by-cycle basis.

* * * * *